United States Patent
Nakamura

(10) Patent No.: US 9,530,909 B2
(45) Date of Patent: Dec. 27, 2016

(54) PHOTODIODE AND ULTRAVIOLET SENSOR

(71) Applicant: MURATA MANUFACTURING CO., LTD., Nagaokakyo-shi, Kyoto-fu (JP)

(72) Inventor: Kazutaka Nakamura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 625 days.

(21) Appl. No.: 13/753,993

(22) Filed: Jan. 30, 2013

(65) Prior Publication Data

US 2013/0140561 A1    Jun. 6, 2013

Related U.S. Application Data

(63) Continuation of application No. PCT/JP2011/070720, filed on Sep. 12, 2011.

(30) Foreign Application Priority Data

Sep. 13, 2010  (JP) ................................. 2010-204232

(51) Int. Cl.
*H01L 31/0328* (2006.01)
*H01L 31/0224* (2006.01)
(Continued)

(52) U.S. Cl.
CPC ... *H01L 31/0328* (2013.01); *H01L 31/022408* (2013.01); *H01L 31/109* (2013.01); *H01L 31/18* (2013.01)

(58) Field of Classification Search
CPC .................. H01L 31/0328; H01L 31/022408; H01L 31/109; H01L 31/18
(Continued)

(56) References Cited

U.S. PATENT DOCUMENTS 7,635,906 B2   12/2009   Nakamura et al.
2008/0252202 A1*  10/2008   Li et al. ........................ 313/504
(Continued)

FOREIGN PATENT DOCUMENTS

JP    2004172166 A    6/2004
JP    2010087482 A    4/2010
WO    WO-2007122750 A1    11/2007

OTHER PUBLICATIONS

Written Opinion and International Search Report issued in PCT/JP2011/070720, mailed Oct. 4, 2011.

*Primary Examiner* — Fernando L Toledo
*Assistant Examiner* — Neil Prasad
(74) *Attorney, Agent, or Firm* — Arent Fox LLP

(57) ABSTRACT

A p-type semiconductor layer containing a solid solution of NiO and ZnO as a principal component is joined to an n-type semiconductor layer containing ZnO as a principal component, and the p-type semiconductor layer contains a rare earth element R. The content of the rare earth element R is preferably 0.001 to 1 mole with respect to 100 moles of the principal component. Further, Y, La, Ce, Pr, Nd, Sm, Eu, Gd, Tb, Dy, Ho, Er, Tm and Yb can be used as the rare earth element, for example. An internal electrode 4 is preferably principally composed of a composite oxide containing the rare earth element R and Ni. Thereby, photoelectric conversion efficiency can be improved, and ultraviolet light can be directly detected as a photocurrent without externally disposing a power source circuit.

20 Claims, 3 Drawing Sheets

(51) Int. Cl.
*H01L 31/109* (2006.01)
*H01L 31/18* (2006.01)
(58) Field of Classification Search
USPC .......................................................... 257/43
See application file for complete search history.

(56) References Cited

U.S. PATENT DOCUMENTS

2009/0133741 A1* 5/2009 Higuchi et al. ............... 136/252
2010/0201664 A1* 8/2010 Lee et al. ...................... 345/207

* cited by examiner

PHOTODIODE AND ULTRAVIOLET SENSOR

This is a continuation of application Serial No. PCT/JP2011/070720, filed Sep. 12, 2011, the entire contents of which are incorporated herein by reference.

TECHNICAL FIELD

The present invention relates to a photodiode and an ultraviolet sensor, and more particularly relates to a photodiode in which a p-type semiconductor layer is joined to an n-type semiconductor layer in the form of a hetero junction by using an oxide compound semiconductor, and a photodiode type ultraviolet sensor using the same.

BACKGROUND ART

Ultraviolet sensors have been widely used as an ultraviolet detection device in a germicidal lamp for sterilizing bacteria floating in air or water, an ultraviolet irradiation apparatus or the like, and in recent years, the ultraviolet sensor has also been expected to be applied to an optical communication device.

As this type of ultraviolet sensor, a sensor using a diamond semiconductor or a SiC semiconductor as a sensing material has been known hitherto. However, these diamond semiconductors and SiC semiconductors have defects in that the ability of materials to be processed is inferior and the materials are expensive.

Hence, an oxide semiconductor which is easy in material processing and relatively inexpensive has received attention in recent years, and research on and development of a photodiode type ultraviolet sensor formed by joining a p-type semiconductor layer to an n-type semiconductor layer in the form of a hetero junction by using these oxide semiconductors has been actively pursued.

For example, there is proposed in Patent Document 1, an ultraviolet sensor which includes a (Ni, Zn)O layer composed of an oxide compound semiconductor formed by dissolving ZnO in NiO, a thin film material layer formed so as to cover a part of one main surface of the (Ni, Zn)O layer by sputtering, and a first and a second terminal electrodes formed at both ends of the (Ni, Zn)O layer, and in which an internal electrode is formed in the (Ni, Zn)O layer, the first terminal electrode is electrically connected to the internal electrode and the second terminal electrode is electrically connected to the thin film material layer.

In Patent Document 1, ultraviolet light to be detected does not have to traverse the thin film material layer and reach an upper junction part, and the junction part is directly irradiated with ultraviolet light. Therefore, it is possible to avoid the sensitivity of an ultraviolet sensor from deteriorating by decay of ultraviolet light in transmitting through the thin film material layer. Particularly, when the thin film material layer is made of ZnO, it is possible to obtain an ultraviolet sensor having relatively high wavelength selectivity.

PATENT DOCUMENT

Patent Document 1: JP 2010-87482 A

DISCLOSURE OF THE INVENTION

Problem to be Solved by the Invention

Since the carrier concentration of the (Ni, Zn)O layer in Patent Document 1 is low and the specific resistance of the (Ni, Zn)O layer is high, only a feeble photocurrent can be detected against an incident light quantity, and photoelectric conversion efficiency is low. Therefore, ultraviolet light in Patent Document 1 had to be detected by changes in a resistance by externally disposing a power source circuit.

That is, since the intensity of ultraviolet light has to be detected as changes in a resistance value by externally disposing a power source circuit, there were problems that a mounting space for the power source circuit had to be secured, resulting in an increase in size of a device.

The present invention was made in view of such a situation, and it is an object of the present invention to provide a photodiode capable of directly detecting ultraviolet light as a photocurrent without externally disposing a power source circuit by improving the photoelectric conversion efficiency of the photodiode, and an ultraviolet sensor using the same.

Means for Solving the Problem

In order to achieve the above-mentioned object, the present inventor made earnest investigations using (Ni, Zn)O as a p-type oxide semiconductor and ZnO as an n-type oxide semiconductor, and consequently the present inventor obtained findings that the photoelectric conversion efficiency can be improved by allowing trace amounts of rare earth elements to be contained in the (Ni, Zn)O to form a p-type semiconductor layer.

The present invention was made based on such findings, and a photodiode of the present invention is a photodiode formed by joining a p-type semiconductor layer containing a solid solution of NiO and ZnO as a principal component to an n-type semiconductor layer containing ZnO as a principal component, wherein the p-type semiconductor layer contains a rare earth element.

In the photodiode of the present invention, the content of the rare earth element is preferably 0.001 to 1 mole with respect to 100 moles of the principal component.

Moreover, in the photodiode of the present invention, the rare earth element preferably includes at least one of Y, La, Ce, Pr, Nd, Sm, Eu, Gd, Tb, Dy, Ho, Er, Tm and Yb.

Further, an ultraviolet sensor of the present invention includes the photodiode according to any one of the above descriptions.

Also, in the ultraviolet sensor of the present invention, an internal electrode principally composed of a composite oxide containing a rare earth element and Ni is preferably embedded in the p-type semiconductor layer constituting the photodiode.

Effect of the Invention

According to the photodiode of the present invention, an ultraviolet photodiode formed by joining a p-type semiconductor layer containing a solid solution of NiO and ZnO as a principal component to an n-type semiconductor layer containing ZnO as a principal component contains the rare earth element (for example, Y, La, Ce, Pr, Nd, Sm, Eu, Gd, Tb, Dy, Ho, Er, Tm, Yb and the like) in the p-type semiconductor layer, and trivalent Ni ions are produced to increase carrier concentration, and thereby, the conversion of the p-type semiconductor layer to a higher grade semiconductor is promoted and the specific resistance of the p-type semiconductor layer is reduced. When such conversion to a higher grade semiconductor is promoted, a barrier is formed and a depletion layer is formed at a junction interface between the p-type semiconductor layer and the n-type semiconductor layer. Further, since the carrier concentration is increased as described above, the thickness of the depletion layer is increased, and thereby photoelectric conversion efficiency is improved.

By setting the content of the rare earth element at 0.001 to 1 mole with respect to 100 moles of the principal component, it is possible to attain a photodiode having higher photoelectric conversion efficiency without segregating a heterophase at a crystal grain boundary or a grain surface, or without forming an unnecessary oxygen defect or impurities (donor).

Further, since it includes the photodiode according to any one of the above descriptions, it is possible to generate a large photocurrent in the ultraviolet sensor of the present invention, and it becomes possible to directly detect the photocurrent without detecting changes in a resistance value.

It is therefore unnecessary to detect the intensity of ultraviolet light as changes in a resistance value by externally disposing a power source circuit like a conventional ultraviolet sensor, and it is possible to obtain an ultraviolet sensor which can directly detect a desired large photocurrent.

In addition, since the internal electrode principally composed of a composite oxide containing a rare earth element and Ni is embedded in the p-type semiconductor layer constituting the photodiode, it is possible to improve the photoelectric conversion efficiency by allowing a small amount of rare earth elements to be contained in the p-type semiconductor layer. That is, when the internal electrode is formed of the above-mentioned composite oxide, the rare earth element can be diffused into the p-type semiconductor layer, although in a slight amount, in a firing process, and thereby the photoelectric conversion efficiency can be improved only by allowing small amounts of rare earth elements to be contained in the p-type semiconductor layer.

MODE FOR CARRYING OUT THE INVENTION

Next, embodiments of the present invention will be described in detail with reference to accompanying drawings.

Figure 1:
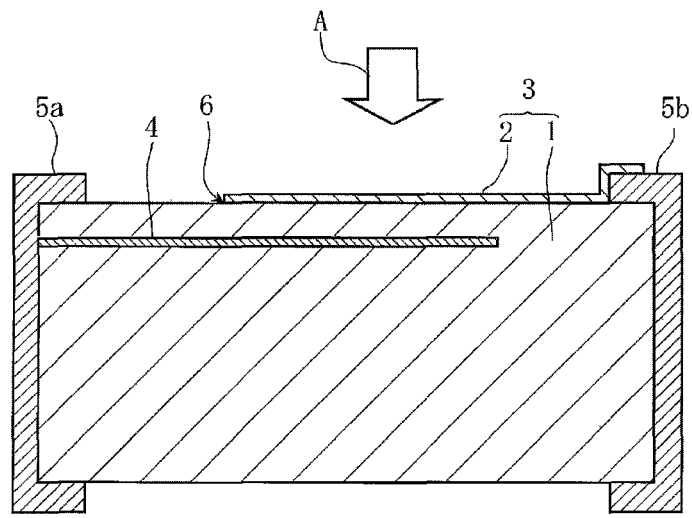
FIG. 1 is a sectional view schematically showing an embodiment of an ultraviolet sensor of the present invention.

FIG. 1 is a sectional view schematically showing an embodiment of an ultraviolet sensor of the present invention.

This ultraviolet sensor has a p-type semiconductor layer 1 containing a solid solution of NiO and ZnO as a principal component, and an n-type semiconductor layer 2 containing ZnO as a principal component, and the n-type semiconductor layer 2 is joined to the p-type semiconductor layer 1 where a part of the surface of the p-type semiconductor layer 1 is exposed. Further, the p-type semiconductor layer 1 forms a photodiode 3 with the n-type semiconductor layer 2.

An internal electrode 4 is embedded in the p-type semiconductor layer 1, and a first terminal electrode 5a and a second terminal electrode 5b are formed at ends of the p-type semiconductor layer 1. That is, the internal electrode 4 is embedded in an upper portion of the p-type semiconductor layer 1 with an end of the internal electrode exposed to a surface, and the first terminal electrode 5a is formed at one end of the p-type semiconductor layer 1 so as to be electrically connected to the internal electrode 4. The second terminal electrode 5b is formed at the other end of the p-type semiconductor layer 1 so as to be electrically connected to the n-type semiconductor layer 2.

In addition, a first plating film made of Ni or the like and a second plating film made of Sn or the like are formed in succession on the surface of an external electrode made of Ag or the like in the first and second terminal electrodes 5a and 5b.

When the ultraviolet sensor thus formed is irradiated with ultraviolet light as shown by an arrow A, and a depletion layer formed at a junction interface 6 between the n-type semiconductor layer 2 and the p-type semiconductor layer 1 is irradiated with ultraviolet light, carriers are excited, and thereby a photocurrent is generated; by detecting this photocurrent, the intensity of ultraviolet light can be detected.

The p-type semiconductor layer 1 is composed of $(Ni_{1-x}Zn_x)O$ (hereinafter, denoted by (Ni, Zn)O) containing a solid solution of NiO and ZnO as a principal component, as shown in the following general formula A, $$100(Ni,Zn)O + \alpha RO_{3/2} \quad (A)$$

and contains a rare earth element R in the form of oxide.

By having the rare earth element R to be contained in the p-type semiconductor layer 1 as described above, trivalent Ni ions are produced to increase carrier concentration, the conversion of the p-type semiconductor layer to a higher grade semiconductor is promoted, and the specific resistance of the p-type semiconductor layer is reduced. When the conversion to a higher grade semiconductor is thus promoted, a barrier is formed and a depletion layer is formed at the junction interface 6 between the p-type semiconductor layer 1 and the n-type semiconductor layer 2. Since the carrier concentration is increased as described above, the thickness of the depletion layer is increased, and thereby photoelectric conversion efficiency is improved.

The rare earth element R is not particularly limited, and Y, La, Ce, Pr, Nd, Sm, Eu, Gd, Tb, Dy, Ho, Er, Tm, Yb and the like can be used. Inexpensive La can be preferably used from the viewpoint of economy.

The content of the rare earth element R is also not particularly limited, and the content is preferably 0.001 to 1 mole with respect to 100 moles of the principal component. When the content of the rare earth element is less than 0.001 moles with respect to 100 moles of the principal component, it is not possible to exert an action of increasing trivalent Ni since the content of the rare earth element is too small. On the other hand, when the content of the rare earth element is more than 1 mole with respect to 100 moles of the principal component, there is a possibility that a heterophase such as $RNiO_3$ is segregated at a crystal grain boundary or a grain surface, and an oxygen defect or impurities (donor) are formed to impair a reduction in a resistance since the content of the rare earth element is excessive.

In addition, the compounding molar ratio x of Zn in the above general formula (A) preferably satisfies $0.2 \leq x \leq 0.4$ from the viewpoint of stably obtaining good sensitivity. The reason for this is that when x is less than 0.2, the content of Ni is excessive, and therefore there is a possibility of an increase in a resistance, and on the other hand, when x is more than 0.4, the content of Zn is excessive, and therefore there is a possibility that ZnO grains are precipitated at a crystal grain boundary and (Ni, Zn)O is converted to an n-type semiconductor.

The n-type semiconductor layer 2 contains ZnO as a principal component and contains a trace amount of Al, Co, In, Ga or the like as a dopant. As a result of containing such a dopant, this layer is provided with a conductive property and converted to an n-type semiconductor. In addition, the n-type semiconductor layer 2 may contain a trace amount of another additive, and may contain, for example, Fe, Ni or Mn as a diffusing agent. Also, it may include a trace amount of Zr, Si or the like as an impurity, which does not affect semiconductor properties.

The materials constituting the internal electrode 4 are not particularly limited, and Pd, Pt or the like can be used, but it is preferred that a composite oxide containing an oxide having a perovskite structure represented by a general formula $RNiO_3$ or an oxide represented by a general formula $R_2NiO_4$, which is principally composed of a rare earth element R and Ni, is used for the following reason.

Although the rare earth element R is hard to become diffused to a (Ni, Zn)O side as compared with Ni during firing, a slight amount does diffuse to the (Ni, Zn)O side. Consequently, the fired p-type semiconductor layer 1 exerts an action substantially equal to the action of adding an extremely trace amount of the rare earth element R to (Ni, Zn)O. Therefore, it becomes possible to promote a reduction in a resistance of the p-type semiconductor layer 1 by only adding a smaller amount of the rare earth element to (Ni, Zn)O. Furthermore, since an expensive noble metal material such as Pt or Pd does not need to be used, an increase in price of the ultraviolet sensor can be suppressed.

For the above-mentioned reason, the internal electrode 4 is preferably formed of the above composite oxide principally composed of the rare earth element R and Ni.

As such a rare earth element, an element (Y, La, Ce, Pr, Nd, Sm, Eu, Gd, Tb, Dy, Ho, Er, Tm, Yb and the like) similar to the rare earth element R added to the p-type semiconductor layer 1 can be used.

Next, a method for manufacturing the above-mentioned ultraviolet sensor will be described in detail for the case where the above composite oxide is used for an internal electrode material.

Preparation of ZnO Sintered Body

A ZnO powder, various doping agents, and an additive to be used as required as a diffusing agent or the like are prepared and weighed in predetermined amounts. A solvent such as pure water is added to these weighed compounds, and the resulting mixture is mixed and pulverized in a wet manner by using a ball mill employing balls such as PSZ (partially stabilized zirconia) beads or the like as a pulverizing medium to obtain a slurry-like mixture. Subsequently, after the slurry-like mixture is dehydrated and dried, the slurry is granulated to have a predetermined particle diameter, and then resulting grains are calcined at a predetermined temperature for about 2 hours, for example, to obtain a calcined powder. Next, after a solvent such as pure water is again added to the calcined powder thus obtained, the resulting mixture is pulverized in a wet manner by using a ball mill employing balls as a pulverizing medium to obtain a slurry-like pulverized material. Then, the slurry-like pulverized material is dehydrated and dried, and then pure water, a dispersing agent, a binder, a plasticizer and the like are added to prepare a slurry for forming a ZnO green sheet having a predetermined thickness. Thereafter, the slurry for forming is subjected to a method of forming such as a doctor blade method. Subsequently, the predetermined number of the ZnO green sheets are laminated and then press-bonded to prepare a press-bonded product. Then, after the press-bonded product is degreased, it is fired to obtain a ZnO sintered body.

Preparation of (Ni, Zn)O Green Sheet

A NiO powder, a ZnO powder, and a predetermined rare earth oxide are prepared. The NiO powder and the ZnO powder are weighed so that the compounding molar ratio x of Zn is 0.2 to 0.4, and a rare earth oxide is weighed preferably so that the content of the rare earth oxide is 0.001 to 1 mole with respect to 100 moles of the principal component. Then, a solvent such as pure water or the like is added to these weighed compounds, and the resulting mixture is mixed and pulverized in a wet manner in a ball mill using balls as a pulverizing medium to obtain a slurry-like mixture. Subsequently, this mixture is dehydrated, dried, and granulated to have a predetermined particle diameter, and then calcined at a predetermined temperature for about 2 hours, for example, to obtain a calcined powder. Next, after a solvent such as pure water is again added to the calcined powder thus obtained, the resulting mixture is adequately pulverized in a wet manner in a ball mill using balls as a pulverizing medium to obtain a slurry-like pulverized material. Next, the slurry-like pulverized material is dehydrated and dried, and then an organic solvent, a dispersing agent, a binder and a plasticizer are added to prepare a slurry for forming. Then, the slurry is formed by using a method of forming such as a doctor blade method, and thereby, a (Ni, Zn)O green sheet having a predetermined thickness is obtained.

Preparation of Paste for Forming Internal Electrode

A NiO powder and a $R_2O_3$ powder (R: a rare earth element) are weighed so that the proportion of moles between these compounds is 2:1, and then a solvent such as pure water is added to these weighed compounds, and the resulting mixture is mixed and pulverized in a wet manner in a ball mill using balls as a pulverizing medium to obtain a slurry-like mixture. Subsequently, after the slurry-like mixture is dehydrated and dried, the slurry is granulated to have a predetermined particle diameter, and then resulting grains are calcined at a predetermined temperature for about 2 hours, for example, to obtain a calcined powder. Next, after a solvent such as pure water is again added to the calcined powder thus obtained, the resulting mixture is adequately pulverized in a wet manner in a ball mill using balls as a pulverizing medium to obtain a slurry-like pulverized material. Then, the slurry-like pulverized material is dehydrated and dried to obtain a composite oxide powder containing an oxide represented by a general formula $RNiO_3$ or an oxide represented by a general formula $R_2NiO_4$. The obtained composite oxide powder is mixed with an organic vehicle, and the resulting mixture is kneaded with a three roll mill to prepare a paste for forming an internal electrode.

An organic vehicle is formed by dissolving a binder resin in an organic solvent, and the proportion between the binder resin and the organic solvent is adjusted so as to be 1 to 3:7 to 9, for example, in terms of a volume ratio. The binder resin is not particularly limited, and for example, an ethyl cellulose resin, a nitrocellulose resin, an acrylic resin, an alkyd resin, or a combination of these resins can be used. Further, the organic solvent is not particularly limited, and α-terpineol, xylene, toluene, diethylene glycol monobutyl ether, diethylene glycol monobutyl ether acetate, diethylene glycol monoethyl ether, and diethylene glycol monoethyl ether acetate can be used singly, or can be used in combination thereof.

Preparation of Formed Product

Figure 2:
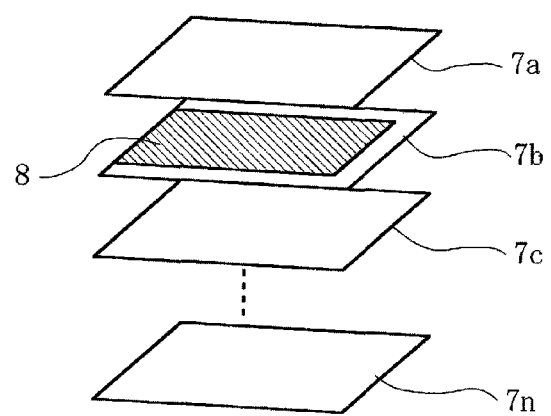
FIG. 2 is an exploded perspective view of a formed product.

A method of preparing a formed product will be described with reference to FIG. 2.

First, the predetermined number of (Ni, Zn)O green sheets 7a, 7b, 7c, . . . , and 7n are prepared, and onto the surface of (Ni, Zn)O green sheet 7b, the above-mentioned paste for forming an internal electrode is applied to form a conductive film 8.

Next, a predetermined number of (Ni, Zn)O green sheets 7c to 7n not provided with the conductive film are laminated, and the (Ni, Zn)O green sheet 7b provided with the conductive film 8 is laminated thereon, and further a (Ni, Zn)O green sheet 7a not provided with the conductive film is laminated thereon, and these sheets are press-bonded to prepare a formed product.

Preparation of P-Type Semiconductor Layer 1

The formed product prepared in the above manner is degreased, and then fired at a temperature around 1200° C. for about 5 hours to simultaneously fire the conductive film 8 and the (Ni, Zn)O green sheets 7a to 7n, and thereby, a p-type semiconductor layer 1 in which an internal electrode 4 is embedded is obtained.

Preparation of Terminal Electrode 5a, 5b

A paste for forming an external electrode is applied to both ends of the p-type semiconductor layer 1 and fired to form an external electrode. The conductive material in the paste for forming an external electrode is not particularly limited as long as it has a good electric conductivity, and Ag, Ag—Pd and the like can be used as the conductive material.

Thereafter, electroplating is performed to form a plating film having a two-layer structure composed of a first plating film and a second plating film, and thereby, a first terminal electrode 5a and a second terminal electrode 5b are formed.

Formation of N-Type Semiconductor Layer 2

Sputtering is performed through a metal mask having a predetermined opening using a ZnO sintered body as a target to form an n-type semiconductor layer 2 composed of a ZnO-based thin film on the surface of the p-type semiconductor layer 1 so that a part the surface of the p-type semiconductor layer 1 is exposed and the n-type semiconductor layer 2 is electrically connected to a second terminal electrode 5b, and thereby, an ultraviolet sensor is obtained.

As described above, since the rare earth element is contained in the p-type semiconductor layer 1 in accordance with the present embodiment, trivalent Ni ions are produced to increase carrier concentration, the conversion of the p-type semiconductor layer to a higher grade semiconductor is promoted, and the specific resistance of the p-type semiconductor layer is reduced. When the conversion to a higher grade semiconductor is thus promoted, a barrier is formed and a depletion layer is formed at a junction interface 6 between the p-type semiconductor layer 1 and the n-type semiconductor layer 2. Further, the thickness of the depletion layer is increased since the carrier concentration is increased, and thereby photoelectric conversion efficiency is improved.

Furthermore, it is possible by setting the content of the rare earth element at 0.001 to 1 mole with respect to 100 moles of the principal component, to attain a photodiode having higher photoelectric conversion efficiency without segregating a heterophase at a crystal grain boundary or a grain surface, or without forming an unnecessary oxygen defect or impurities (donor).

It is therefore unnecessary to detect the intensity of ultraviolet light as changes in a resistance value by externally disposing a power source circuit like a conventional ultraviolet sensor, and it is possible to obtain an ultraviolet sensor which can directly detect a desired large photocurrent.

The present invention is not limited to the above-mentioned embodiment. In the above embodiment, a paste for forming an internal electrode containing a composite oxide is prepared, and the paste for forming an internal electrode is applied onto the surface of a (Ni, Zn)O green sheet and then fired to form an internal electrode 4. However, a desired internal electrode can also be formed by preparing a rare earth paste including a principal component composed of a rare earth oxide $R_2O_3$ without allowing the paste for forming an internal electrode to include Ni, and diffusing Ni in the (Ni, Zn)O green sheet toward a rare earth film side during firing the rare earth paste.

Next, examples of the present invention will be described in detail.

EXAMPLES

Preparation of Sample

Preparation of ZnO Sintered Body

ZnO serving as a principal component and $Ga_2O_3$ as a doping agent were weighed so that compounding ratios of these compounds were 99.9 mol % and 0.1 mol %, respectively. After pure water was added to these weighed compounds, the resulting mixture was mixed and pulverized in a ball mill using PSZ beads as a pulverizing medium to obtain a slurry-like mixture of particles having an average particle diameter of 0.5 μm or less. Subsequently, after the slurry-like mixture was dehydrated and dried, the slurry was granulated to have a particle diameter of about 50 μm, and then resulting grains were calcined at 1200° C. for 2 hours to obtain a calcined powder.

Next, after pure water was again added to the calcined powder thus obtained, the resulting mixture was mixed and pulverized in a ball mill using PSZ beads as a pulverizing medium to obtain a slurry-like pulverized material of particles having an average particle diameter of 0.5 μm. The slurry-like pulverized material was dehydrated and dried, and then pure water and a dispersing agent were added thereto, and the resulting mixture was mixed, and a binder and a plasticizer were further added to prepare a slurry for forming, and the slurry for forming was formed into a green sheet having a thickness of 20 μm by using a doctor blade method. Subsequently, the predetermined number of the green sheets was laminated to have a thickness of 20 mm, and was then press-boned for 5 minutes at a pressure of 250 MPa to obtain a press-bonded product. After the press-bonded product was degreased, it was fired at 1200° C. for 20 hours to obtain a ZnO sintered body.

Preparation of (Ni, Zn)O Green Sheet

A NiO powder and a ZnO powder were weighed so that the proportion of moles between these compounds is 7:3, and further $La_2O_3$, $Pr_6O_{22}$, $Sm_2O_3$, $Dy_2O_3$, $Ho_2O_3$, $Er_2O_3$, $Yb_2O_3$, and $Y_2O_3$ as rare earth oxides were weighed so as to be the contents shown in Table 1 on the element equivalent basis.

Then, pure water was added to these weighed compounds, and the resulting mixture was mixed and pulverized by a ball mill using PSZ beads as a pulverizing medium to obtain a slurry-like mixture. Subsequently, after the slurry-like mixture was dehydrated and dried, the slurry was granulated to have a particle diameter of about 50 μm, and then resulting grains were calcined at 1200° C. for 2 hours to obtain a calcined powder. Next, after pure water was again added to the calcined powder thus obtained, the resulting mixture was pulverized in a ball mill using PSZ beads as a pulverizing medium to obtain a slurry-like pulverized material of particles having an average particle diameter of 0.5 μm. Then, after the slurry-like pulverized material was dehydrated and dried, an organic solvent and a dispersing agent were added thereto, and the resulting mixture was mixed, and a binder and a plasticizer were further added to prepare a slurry for forming. The slurry for forming was formed into a (Ni, Zn)O green sheet having a thickness of 10 lam by using a doctor blade method.

Paste for Internal Electrode

A NiO powder and a $La_2O_3$ powder as a rare earth oxide were weighed so that the proportion of moles between these compounds was 2:1, and then pure water was added to these weighed compounds, and the resulting mixture was mixed and pulverized in a ball mill using PSZ beads as a pulverizing medium to obtain a slurry-like mixture. Subsequently, after the slurry-like mixture was dehydrated and dried, the slurry was granulated to have a particle diameter of about 50 μm, and then resulting grains were calcined at 1200° C. for 2 hours to obtain a calcined powder. Next, after pure water was again added to the calcined powder thus obtained, the resulting mixture was pulverized in a ball mill using PSZ beads as a pulverizing medium to obtain a slurry-like pulverized material of particles having an average particle diameter of 0.5 μm. The slurry-like pulverized material was dehydrated and dried to obtain a $LaNiO_3$ powder. Thereafter, the obtained $LaNiO_3$ powder was mixed with an organic vehicle, and the resulting mixture was kneaded with a three roll mill to prepare a paste for forming an internal electrode for sample Nos. 1 to 13.

In addition, an organic vehicle was prepared by mixing an ethyl cellulose resin and α-terpineol so that the percentage of the ethyl cellulose resin as a binder resin was 30 vol % and the percentage of α-terpineol as an organic solvent was 70 vol %.

Further, a Pd paste was prepared by use of a commercially available Pd powder and used as a paste for forming an internal electrode for sample Nos. 14 and 15.

Preparation of Formed Product

A paste for forming an internal electrode was applied onto the surface of one of the (Ni, Zn)O green sheets by screen printing, and dried at 60° C. for 1 hour to form a conductive film having a predetermined pattern.

Subsequently, 20 (Ni, Zn)O green sheets not provided with the conductive film were laminated, and a (Ni, Zn)O green sheet provided with the conductive film was laminated thereon, and further a (Ni, Zn)O green sheet not provided with the conductive film was laminated thereon. These sheets were press-bonded at a pressure of 20 MPa to form a laminate, and the resulting laminate was cut into a size of 2.5 mm×1.5 mm to prepare a formed product.

Preparation of P-Type Semiconductor Layer

The formed product was gradually degreased at 300° C., and then fired at 1200° C. for 1 hour in the air to obtain a p-type semiconductor layer.

Preparation of Terminal Electrode

An Ag paste was applied to both ends of the p-type semiconductor layer and fired at 800° C. for 10 minutes to prepare a first and a second external electrodes. Then, the surfaces of the first and the second external electrodes were plated by electroplating to form a Ni coating and a Sn coating in succession, and thereby, a first terminal electrode and a second terminal electrode were prepared.

Formation of N-Type Semiconductor Layer

Sputtering was performed through a metal mask using a ZnO sintered body as a target so that an n-type semiconductor layer covers a part of one main surface of a p-type semiconductor layer and overlaps a part of a second terminal electrode to prepare an n-type semiconductor layer with a predetermined pattern having a thickness of about 0.5 μm, and thereby, samples of sample Nos. 1 to 15 were obtained.

Evaluation of Sample

Figure 3:
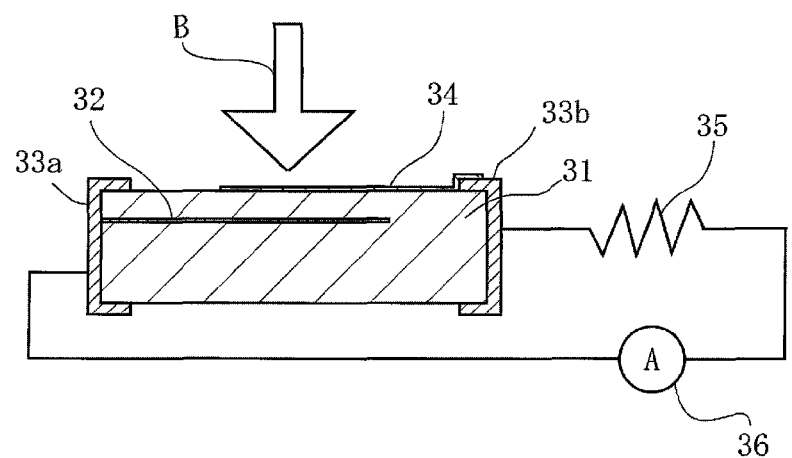
FIG. 3 is a view showing a measurement method of an example.

In each sample of the sample Nos. 1 to 15, an internal electrode 32 is embedded in a p-type semiconductor layer 31, a first terminal electrode 33a and a second terminal electrode 33b are formed at both ends of the p-type semiconductor layer 31, and an n-type semiconductor layer 34 is joined to the surface of the p-type semiconductor layer 31 as shown in FIG. 3. The first terminal electrode 33a and the second terminal electrode 33b were connected to an ammeter 36 through a resistance 35. In a darkroom, an outer surface on the n-type semiconductor layer 34 side of each sample was irradiated with ultraviolet light having a specific wavelength from an ultraviolet light source equipped with a spectroscope as shown by an arrow B, and a current flowing between the first terminal electrode 33a and the second terminal electrode 33b was measured with the ammeter 36 to measure a wavelength of maximum sensitivity, or a peak wavelength, and a detectable wavelength band, or a spectral response range.

Next, a digital electrometer (TR8652, manufactured by ADVANTEST CORPORATION) was interposed between the first terminal electrode 33a and the second terminal electrode 33b of each sample, and current values at the time when a voltage value applied to the sample was varied by use of the digital electrometer were measured, and thereby a voltage-current characteristic (hereinafter, referred to as a "V-I characteristic") at the time when the sample was not irradiated and the sample was irradiated with light of a peak wavelength of each sample was measured.

Figure 4:
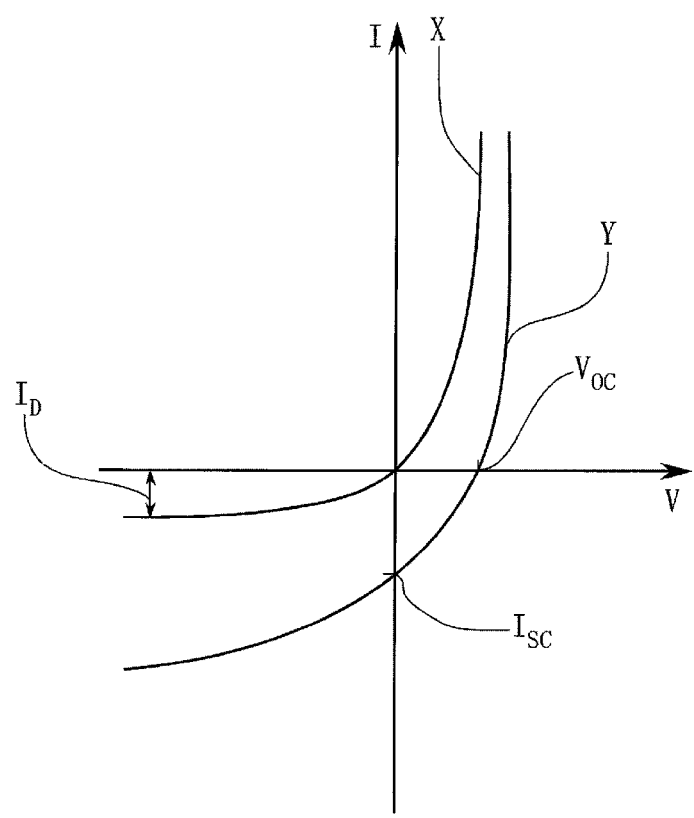
FIG. 4 is a view showing a conceptual diagram of a voltage-current characteristic (V-I characteristic) measured in an example.

FIG. 4 is a conceptual diagram of the V-I characteristic. In the figure, a horizontal axis represents a voltage (V) and a vertical axis represents a current (μA), and X indicates a V-I characteristic in the case of non-irradiation and Y indicates a V-I characteristic in the case of light-irradiation.

A current value at the time when a voltage of −0.5 V was applied to each sample designating a p-type semiconductor layer side as a positive electrode was determined as a dark current $I_D$ from the V-I characteristic in the case of non-irradiation, and an open voltage $V_{OC}$ (a voltage at the time when I=0) and a short circuit current $I_{SC}$ (a current at the time when V=0) were determined from the V-I characteristic in the case of light-irradiation.

Further, a photocurrent to an incident light quantity at each peak wavelength, that is, a light-receiving sensitivity S was determined.

In addition, the irradiation intensity of light was set at 1 mW/cm², and the measurement temperature was controlled so as to be 25° C.±1° C.

Table 1 shows the kind and a content of the rare earth oxide, internal electrode material, light-receiving sensitivity S, open voltage $V_{OC}$, short circuit current $I_{SC}$, dark current $I_D$, peak wavelength, and spectral response range in each sample of the sample Nos. 1 to 15.

TABLE 1

| Sample No. | 100 (Ni, Zn) O + α RO₃/₂ R | 100 (Ni, Zn) O + α RO₃/₂ α | Internal Electrode | Light-Receiving Sensitivity S (mA/mW) | Open Voltage $V_{OC}$ (V) | Short Circuit Current $I_{SC}$ (μA) | Dark Current $I_D$ (nA) | Peak Wavelength (nm) | Spectral Response Range (nm) |
|---|---|---|---|---|---|---|---|---|---|
| 1* | — | 0 | LaNiO₃ | 0.04 | 0.35 | 0.2 | 0.02 | 330 | 240-390 |
| 2 | La | 0.001 | LaNiO₃ | 0.10 | 0.34 | 0.3 | 0.01 | 300 | 240-390 |
| 3 | La | 0.01 | LaNiO₃ | 0.24 | 0.35 | 1.2 | 0.005 | 300 | 240-400 |
| 4 | La | 0.1 | LaNiO₃ | 0.35 | 0.35 | 1.8 | 0.005 | 370 | 240-400 |
| 5 | La | 1.0 | LaNiO₃ | 0.15 | 0.35 | 0.9 | 0.01 | 370 | 240-410 |
| 6** | La | 10.0 | LaNiO₃ | 0.08 | 0.35 | 0.6 | 1.05 | 370 | 240-430 |
| 7 | Pr | 0.01 | LaNiO₃ | 0.30 | 0.36 | 1.6 | 0.004 | 310 | 240-400 |
| 8 | Sm | 0.01 | LaNiO₃ | 0.31 | 0.36 | 1.7 | 0.003 | 310 | 240-390 |
| 9 | Dy | 0.01 | LaNiO₃ | 0.33 | 0.36 | 1.8 | 0.01 | 330 | 240-390 |
| 10 | Ho | 0.01 | LaNiO₃ | 0.32 | 0.35 | 1.7 | 0.01 | 320 | 240-390 |
| 11 | Er | 0.01 | LaNiO₃ | 0.33 | 0.34 | 1.8 | 0.009 | 310 | 240-390 |
| 12 | Yb | 0.01 | LaNiO₃ | 0.30 | 0.33 | 1.6 | 0.01 | 300 | 240-390 |
| 13 | Y | 0.01 | LaNiO₃ | 0.37 | 0.34 | 2.0 | 0.01 | 330 | 240-390 |
| 14* | — | — | Pd | — | 0.32 | 0.0001 or less | 0.0001 or less | 370 | 300-420 |
| 15 | La | 1.0 | Pd | 0.14 | 0.35 | 0.6 | 0.03 | 370 | 240-410 |

*indicates out of the scope of the present invention
**indicates out of the preferred scope of the present invention Sample No. 1 was found to be as low as 0.04 mA/mW in the light-receiving sensitivity S and to be inferior in photoelectric conversion efficiency since the rare earth element was not contained therein.

In sample No. 14, the photocurrent could not be directly detected with an ammeter since the rare earth element was not present, as with the sample No. 1, and further Pd was used in the internal electrode. The reason for this is probably that when Pd is used, an oxygen-release action of Pd occurs during firing and a firm oxide layer is formed at a crystal grain boundary or on the surface of the p-type semiconductor layer, and consequently an apparent specific resistance of the p-type semiconductor layer is increased, and therefore only a slight photocurrent equal to or below a detection current could be detected.

On the other hand, it was found in sample Nos. 2 to 13 that since the rare earth element was contained in the p-type semiconductor layer, the dark current $I_D$ was decreased and on the other hand, the short circuit current $I_{SC}$ was increased, and the light-receiving sensitivity S was also increased and photoelectric conversion efficiency was improved.

Further, the peak wavelength varies depending on the content of the rare earth element R, and the sensitivity of light absorption at the vicinity of a wavelength of 370 nm originated from ZnO was increased as the content of the rare earth element R was increased, as is apparent from the results of the sample Nos. 2 to 6.

Further, the sample No. 15 obtained a good result that the light-receiving sensitivity S was 0.14 mA/mW, since La was contained in the p-type semiconductor layer in an amount of 1.0 mole with respect to 100 moles of the principal component although Pd was used for an internal electrode material.

However, when the p-type semiconductor layer contained La serving as the rare earth element R in an amount of 10 moles with respect to 100 moles of the principal component, as in sample No. 6, the short circuit current $I_{SC}$ was decreased, and on the other hand, the dark current $I_D$ was increased and the light-receiving sensitivity S was deceased. The reason for this is probably that since the content of La is large, a heterophase such as LaNiO₃ is segregated at a crystal grain boundary or a grain surface, and an oxygen defect or donor serving as impurities is formed to impair the photoelectric conversion efficiency.

Therefore, it was found that the content of the rare earth element R in the p-type semiconductor layer was preferably in a range of 0.001 to 1 mole with respect to 100 moles of the principal component.

In addition, it was verified that when the content of the rare earth element R was more than 0.1 moles with respect to 100 moles of the principal component as in sample Nos. 4 to 6, a second wavelength peak appeared also at the vicinity of a wavelength of 300 nm originated from (Ni, Zn)O shorter than a wavelength of 370 nm originated from ZnO, which is a peak wavelength.

INDUSTRIAL APPLICABILITY

The intensity of ultraviolet light can be directly detected by measuring a photocurrent without detecting the intensity of ultraviolet light as changes in a resistance by externally disposing a power source circuit.

DESCRIPTION OF REFERENCE SYMBOLS

1 p-type semiconductor layer
2 n-type semiconductor layer
4 internal electrode

The invention claimed is:

1. A photodiode comprising a p-type semiconductor layer comprising a solid solution of NiO and ZnO as a principal component joined to an n-type semiconductor layer comprising ZnO as a principal component, wherein
the p-type semiconductor layer contains a rare earth element.

2. The photodiode according to claim 1, wherein the content of the rare earth element is 0.001 to 1 mole with respect to 100 moles of the principal component.

3. The photodiode according to claim 2, wherein the rare earth element is at least one member selected from the group consisting of Y, La, Ce, Pr, Nd, Sm, Eu, Gd, Tb, Dy, Ho, Er, Tm and Yb.

4. The photodiode according to claim 3, wherein the composition of the p-type semiconductor layer comprises $100(Ni_{1-x}Zn_x)O+\alpha RO_{3/2}$ in which $0.2 \leq x \leq 0.4$, $\alpha$ is 0.001 to 1, and R is said rare earth element.

5. The photodiode according to claim 3, wherein R is La.

6. The photodiode according to claim 1, wherein the rare earth element is at least one member selected from the group consisting of Y, La, Ce, Pr, Nd, Sm, Eu, Gd, Tb, Dy, Ho, Er, Tm and Yb.

7. An ultraviolet sensor comprising the photodiode according to claim 6.

8. The ultraviolet sensor according to claim 7, comprising an internal electrode comprising a composite oxide containing a rare earth element and Ni is embedded in the p-type semiconductor layer.

9. The ultraviolet sensor according to claim 8, wherein the internal electrode comprises $LaNiO_3$.

10. An ultraviolet sensor comprising the photodiode according to claim 5.

11. The ultraviolet sensor according to claim 10, comprising an internal electrode comprising a composite oxide containing a rare earth element and Ni is embedded in the p-type semiconductor layer.

12. The ultraviolet sensor according to claim 11, wherein the internal electrode comprises $LaNiO_3$.

13. An ultraviolet sensor comprising the photodiode according to claim 4.

14. The ultraviolet sensor according to claim 13 comprising an internal electrode comprising a composite oxide containing a rare earth element and Ni is embedded in the p-type semiconductor layer.

15. The ultraviolet sensor according to claim 14, wherein the internal electrode comprises $LaNiO_3$.

16. An ultraviolet sensor comprising the photodiode according to claim 2.

17. The ultraviolet sensor according to claim 16, comprising an internal electrode comprising a composite oxide containing a rare earth element and Ni is embedded in the p-type semiconductor layer.

18. An ultraviolet sensor comprising the photodiode according to claim 1.

19. The ultraviolet sensor according to claim 18, comprising an internal electrode comprising a composite oxide containing a rare earth element and Ni is embedded in the p-type semiconductor layer.

20. The ultraviolet sensor according to claim 19, wherein the internal electrode comprises $LaNiO_3$.

* * * * *